US009285557B2

(12) United States Patent
Claeys et al.

(10) Patent No.: US 9,285,557 B2
(45) Date of Patent: Mar. 15, 2016

(54) HIGH DENSITY TELECOMMUNICATIONS CHASSIS WITH CABLE MANAGEMENT

(71) Applicant: Tyco Electronics Raychem BVBA, Kessel-Lo (BE)

(72) Inventors: Didier Pierre W Claeys, Schaffen (BE); Danny Ghislain Thijs, Zonhoven (BE)

(73) Assignee: Tyco Electronics Raychem BVBA, Kessel-Lo (BE)

( * ) Notice: Subject to any disclaimer, the term of this patent is extended or adjusted under 35 U.S.C. 154(b) by 0 days.

(21) Appl. No.: 13/912,736

(22) Filed: Jun. 7, 2013

(65) Prior Publication Data

US 2014/0003784 A1   Jan. 2, 2014

Related U.S. Application Data

(60) Provisional application No. 61/665,199, filed on Jun. 27, 2012.

(51) Int. Cl.
*H04Q 1/02*   (2006.01)
*H05K 5/02*   (2006.01)
*G02B 6/44*   (2006.01)

(52) U.S. Cl.
CPC .............. *G02B 6/4446* (2013.01); *H04Q 1/021* (2013.01); *H04Q 1/025* (2013.01); *H05K 5/0226* (2013.01); *H05K 5/0247* (2013.01)

(58) Field of Classification Search
CPC ......... H04Q 1/02; H04Q 1/021; H04Q 1/025; H05K 5/0226–5/247; G02B 6/4446
USPC .............. 350/730; 174/100, 101, 135; 211/26; 361/730
See application file for complete search history.

(56) References Cited

U.S. PATENT DOCUMENTS 2,773,940 A   12/1956   Lebedinsky
3,852,703 A   12/1974   Carney et al.
(Continued)

FOREIGN PATENT DOCUMENTS

DE   3506447       10/1985
DE   37 43 632 A1   7/1989
(Continued)

OTHER PUBLICATIONS

Invitation to Pay Additional Fees with Partial International Search for PCT/EP2013/063477 mailed Nov. 8, 2013.
(Continued)

*Primary Examiner* — Jeremy C Norris
*Assistant Examiner* — Muhammed Azam
(74) *Attorney, Agent, or Firm* — Merchant & Gould P.C.

(57) ABSTRACT

A telecommunications chassis (10/100) is configured for receiving telecommunications equipment. The telecommunications chassis (10/100) defines a top (12), a bottom (14), a front side (16), a rear side (18), a right side (20), and a left side (22), the telecommunications chassis (10/100) defining a central longitudinal axis (36) extending between the top (12) and the bottom (14). A first pair of panels (24/124) is located at the front side (16), a second pair of panels (24/124) is located at the rear side (18), a third pair of panels (24/124) is located at the right side (20), and a fourth pair of panels (24/124) is located at the left side (22). Each panel (24/124) of the pairs of panels (24/124) defines a plurality of receptacles (26/126) for receiving the telecommunications equipment. When mounted to a fixed surface, the telecommunications chassis (10/100) is rotatable relative to the fixed surface about the central longitudinal axis (36). Each panel (24/124) of any given pair of panels (24/124) is pivotable away from the other panel (24/124) of the any given pair of panels (24/124) about a pivot axis (30) parallel to the central longitudinal axis (36) of the chassis (10/100).

17 Claims, 13 Drawing Sheets

(56) References Cited

U.S. PATENT DOCUMENTS

| | | |
|---|---|---|
| 4,480,880 A | 11/1984 | Cather |
| 4,548,453 A | 10/1985 | Mummey et al. |
| 4,603,377 A | 7/1986 | Kabayashi et al. |
| 4,649,236 A | 3/1987 | De Luca et al. |
| 4,665,546 A | 5/1987 | Brey et al. |
| 4,722,702 A | 2/1988 | De Luca et al. |
| 4,737,985 A | 4/1988 | De Luca et al. |
| 4,749,968 A | 6/1988 | Burroughs |
| 4,770,639 A | 9/1988 | Lau |
| 4,820,200 A | 4/1989 | Lau |
| 4,840,568 A | 6/1989 | Burroughs et al. |
| 4,861,281 A | 8/1989 | Warner |
| 4,911,661 A | 3/1990 | Neuwirth |
| 4,975,087 A | 12/1990 | Williams et al. |
| 5,145,416 A | 9/1992 | Cruise et al. |
| 5,170,327 A | 12/1992 | Burroughs |
| 5,199,878 A | 4/1993 | Dewey et al. |
| 5,220,600 A | 6/1993 | Chouanard et al. |
| 5,233,501 A | 8/1993 | Allen et al. |
| D343,828 S * | 2/1994 | Leitermann et al. ......... D13/155 |
| D344,072 S * | 2/1994 | Bates et al. ................. D14/311 |
| 5,393,249 A | 2/1995 | Morgenstern et al. |
| 5,413,494 A | 5/1995 | Dewey et al. |
| 5,417,588 A | 5/1995 | Olson et al. |
| 5,460,441 A | 10/1995 | Hastings et al. |
| 5,467,062 A | 11/1995 | Burroughs |
| 5,482,469 A | 1/1996 | Seiceanu et al. |
| 5,546,282 A | 8/1996 | Hill et al. |
| 5,634,822 A | 6/1997 | Gunell |
| 5,685,741 A | 11/1997 | Dewey et al. |
| 5,738,546 A | 4/1998 | Burroughs et al. |
| 5,784,251 A | 7/1998 | Miller et al. |
| 5,885,112 A | 3/1999 | Louwagie et al. |
| 5,903,829 A | 5/1999 | Anderson et al. |
| 5,909,155 A | 6/1999 | Anderson et al. |
| 5,938,478 A | 8/1999 | Werner |
| 5,955,930 A | 9/1999 | Anderson et al. |
| 6,038,766 A | 3/2000 | Werner |
| 6,049,709 A | 4/2000 | Anderson et al. |
| 6,116,961 A | 9/2000 | Henneberger et al. |
| 6,208,522 B1 | 3/2001 | Manweiler et al. |
| 6,269,162 B1 | 7/2001 | McMillan |
| 6,289,210 B1 | 9/2001 | Anderson et al. |
| 6,327,139 B1 | 12/2001 | Champion et al. |
| 6,438,310 B1 | 8/2002 | Lance et al. |
| 6,504,988 B1 | 1/2003 | Trebesch et al. |
| 6,625,374 B2 | 9/2003 | Holman et al. |
| 6,626,705 B2 | 9/2003 | Perrone et al. |
| 6,650,885 B2 | 11/2003 | Anderson et al. |
| 6,677,520 B2 | 1/2004 | Kim et al. |
| 6,685,033 B1 | 2/2004 | Baddour et al. |
| 6,715,619 B2 | 4/2004 | Kim et al. |
| 6,748,155 B2 | 6/2004 | Kim et al. |
| 6,792,190 B2 | 9/2004 | Xin et al. |
| 6,799,998 B2 | 10/2004 | Henneberger et al. |
| 6,830,466 B2 | 12/2004 | Mendoza |
| 6,875,060 B2 | 4/2005 | Musolf et al. |
| 6,918,793 B2 | 7/2005 | Baker et al. |
| 6,968,111 B2 | 11/2005 | Trebesch et al. |
| 6,975,510 B1 | 12/2005 | Robbins et al. |
| 6,994,593 B2 | 2/2006 | Baker et al. |
| 7,031,588 B2 | 4/2006 | Cowley et al. |
| 7,061,767 B2 | 6/2006 | Schmidtke et al. |
| 7,068,907 B2 | 6/2006 | Schray |
| 7,095,844 B2 | 8/2006 | Baker et al. |
| 7,097,047 B2 | 8/2006 | Lee et al. |
| 7,120,348 B2 | 10/2006 | Trebesch et al. |
| 7,127,042 B2 | 10/2006 | Grosse-Boes et al. |
| 7,137,512 B2 | 11/2006 | Nguyen et al. |
| 7,171,099 B2 | 1/2007 | Barnes et al. |
| 7,197,294 B2 | 3/2007 | Anderson et al. |
| 7,302,154 B2 | 11/2007 | Trebesch et al. |
| 7,308,184 B2 | 12/2007 | Barnes et al. |
| 7,418,182 B2 | 8/2008 | Krampotich |
| 7,437,049 B2 | 10/2008 | Krampotich |
| 7,463,811 B2 | 12/2008 | Trebesch et al. |
| 7,499,623 B2 | 3/2009 | Barnes et al. |
| 7,764,781 B2 | 7/2010 | Gonzalez Blazquez et al. |
| 8,244,203 B2 | 8/2012 | Anderson et al. |
| 8,600,208 B2 | 12/2013 | Badar et al. |
| 2002/0118820 A1 | 8/2002 | Sinclair, III et al. |
| 2002/0173188 A1 | 11/2002 | Follingstad et al. |
| 2003/0072551 A1 * | 4/2003 | Douglas ............... G02B 6/4452 385/135 |
| 2003/0185535 A1 * | 10/2003 | Tinucci ............... G02B 6/4455 385/134 |
| 2003/0222034 A1 | 12/2003 | Champion et al. |
| 2003/0223724 A1 * | 12/2003 | Puetz ................... G02B 6/4452 385/135 |
| 2004/0077220 A1 | 4/2004 | Musolf et al. |
| 2004/0119386 A1 * | 6/2004 | Guidez ....................... 312/265.1 |
| 2006/0067068 A1 * | 3/2006 | Petersen et al. ................ 361/788 |
| 2007/0047894 A1 * | 3/2007 | Holmberg ............ G02B 6/4455 385/135 |
| 2007/0211882 A1 | 9/2007 | Hatte et al. |
| 2007/0211883 A1 | 9/2007 | Franzke et al. |
| 2009/0090538 A1 * | 4/2009 | Jones et al. .................... 174/135 |
| 2011/0267767 A1 | 11/2011 | Sun |

FOREIGN PATENT DOCUMENTS

| | | | |
|---|---|---|---|
| DE | 4207531 A1 * | 12/1991 | ............... H02B 1/30 |
| WO | WO 96/38884 | 12/1996 | |
| WO | WO 99/26427 | 5/1999 | |
| WO | WO 2008/027562 | 3/2008 | |

OTHER PUBLICATIONS

International Search Report and Written Opinion for PCT/EP2013/063477 mailed Jan. 2, 2014.

Two sheets of drawings showing ADC's 64-CKT SKI/Flex Module All Front Access with I/O Monitor, Catalog No. DFX-IFA064, Drawing No. 1102779, Mar. 27, 2000.

Four sheets of drawings showing ADC's Assembly, Chassis Wire Wrap, Flex-X, Catalog No. DFX-1FA064, Drawing No. 1102777, Oct. 6, 2000.

Four sheets of drawings showing ADC's W/W Chassis Assembly Installation, Catalog No. DFS-100001-DPM, Drawing No. 1126536, Aug. 22, 2000.

Two sheets of drawings showing ADC's RJ45 Chassis Assembly Installation, Catalog No. DFS-120001, Drawing No. 1132584, Sep. 28, 2000.

Two sheets of drawings showing ADC's Monitor Panel, 64CKT Installation, Catalog No. DIM-IA3050, Drawing No. 1188817, Oct. 8, 2001.

ADC, "DSX1 New Products, Monitor Panels," 2 pages (date unknown).

TELECT, product sheet entitled "E1 64 Circuit Panel, Telect Part No. E64-5000-1100," obtained from E1 64 Circuit Panel, Telect, Inc. Official Website at http://www.telect.com/index.cfm?object=1499 &op=1,992,701,1430,1495,1498,1499 on Jun. 13, 2001, 3 pages.

TELECT, product sheet entitled "E1 64 Circuit Panel, Telect Part No. E64-5000-1200," obtained from E1 64 Circuit Panel, Telect, Inc. Official Website at http://www.telect.com/index.cfm?object=1500 &op=1,992,701,1430,1495,1498,1500 on Jun. 13, 2001, 3 pages.

* cited by examiner

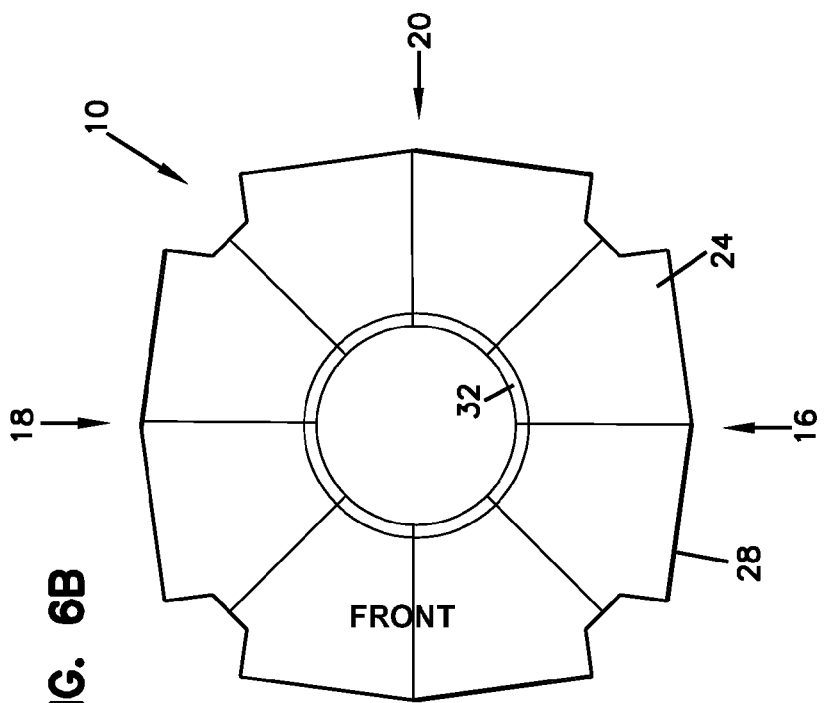
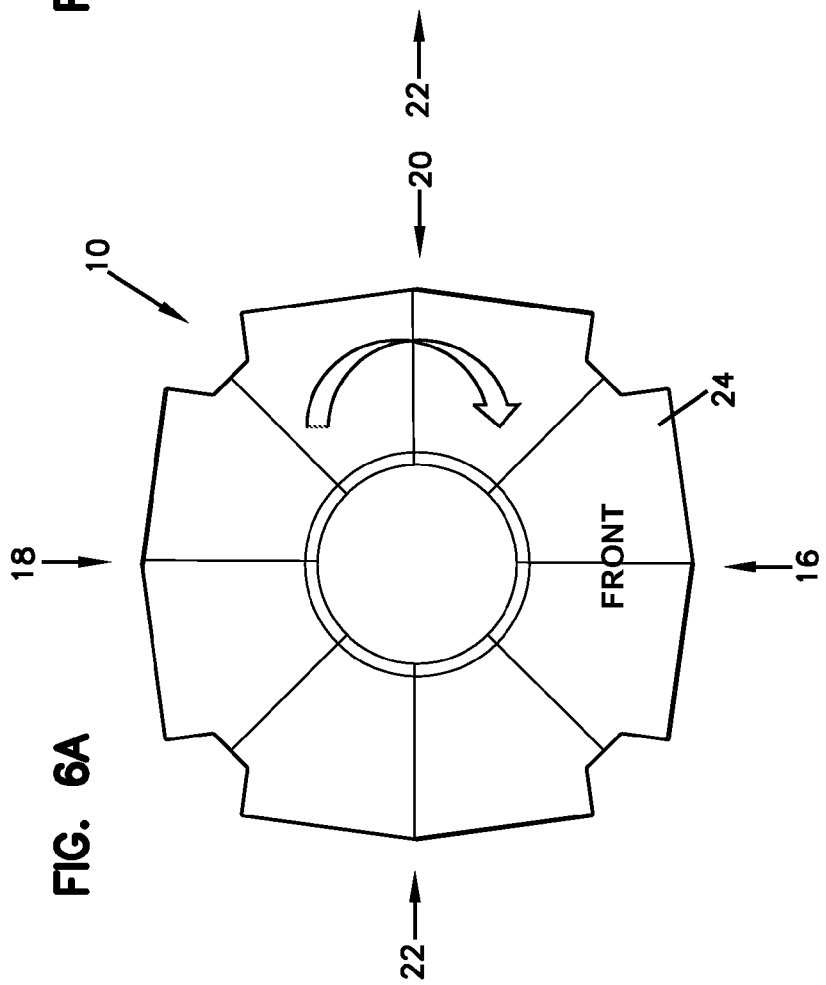

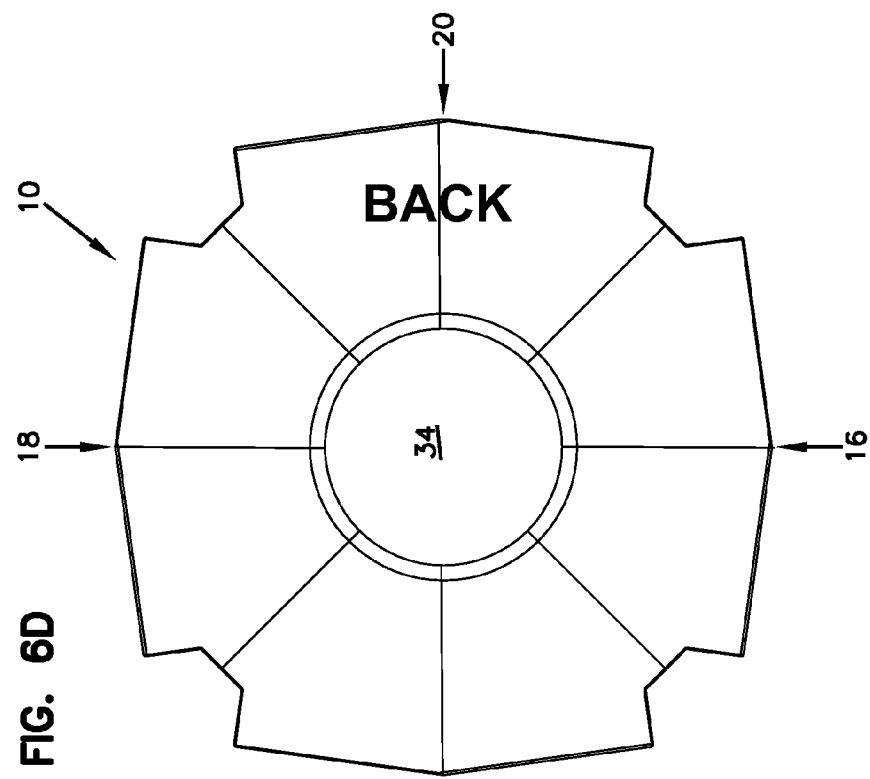
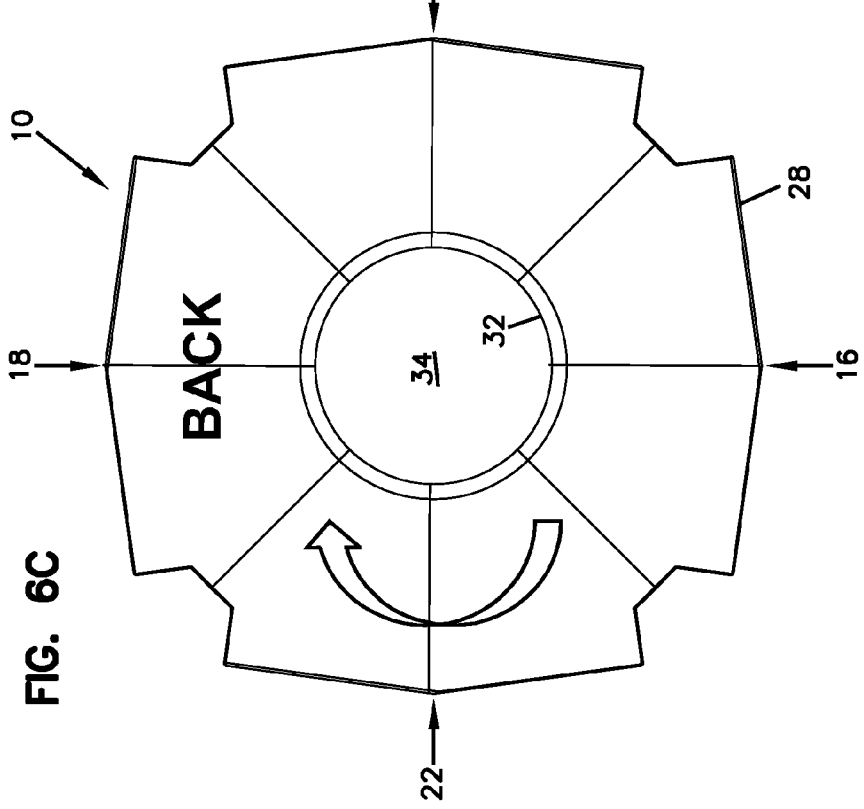

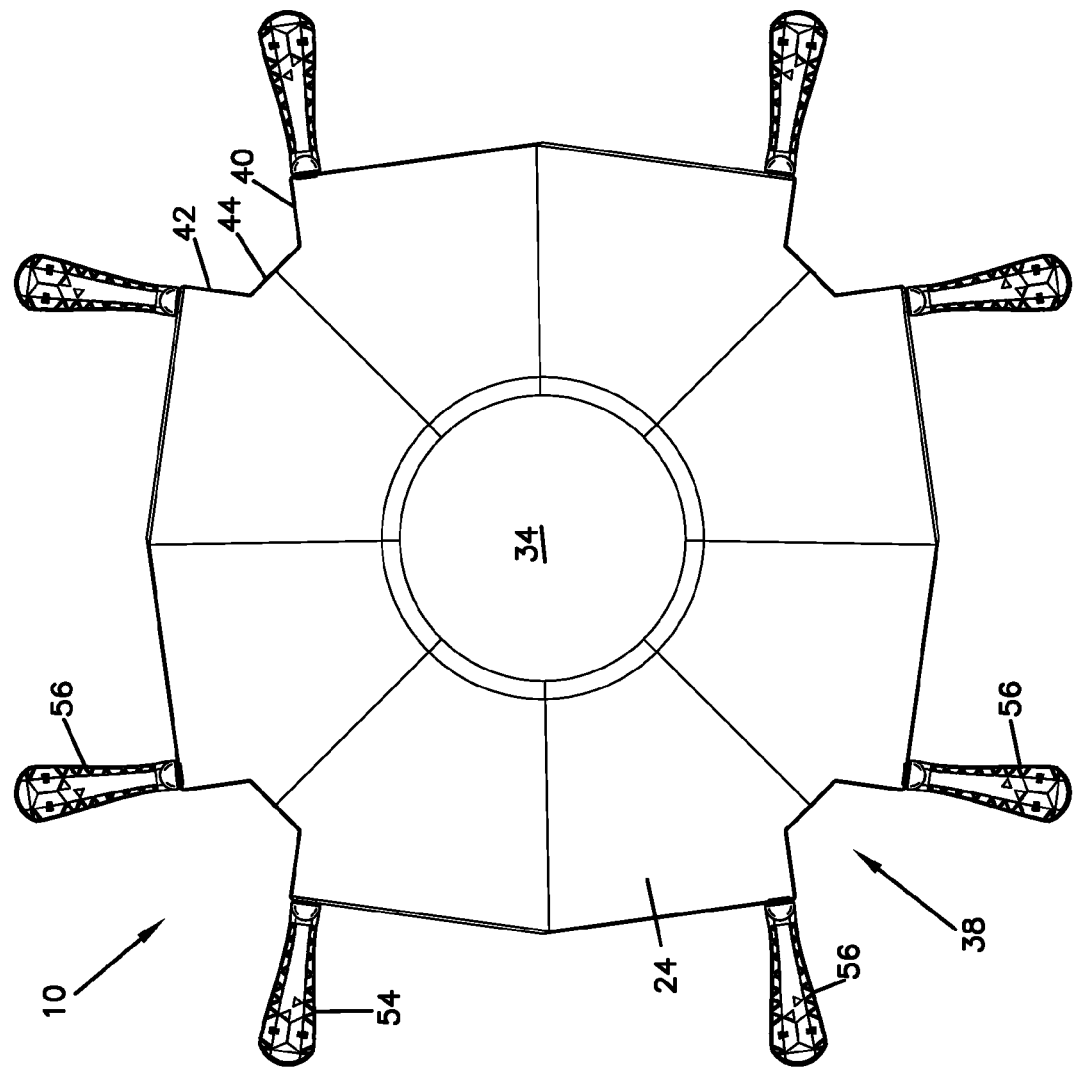

HIGH DENSITY TELECOMMUNICATIONS CHASSIS WITH CABLE MANAGEMENT

CROSS-REFERENCE TO RELATED APPLICATION

The present patent application claims the benefit of U.S. Provisional Patent Application Ser. No. 61/665,199, filed Jun. 27, 2012, which application is hereby incorporated by reference in its entirety.

TECHNICAL FIELD

The present disclosure relates generally to telecommunications equipment. More particularly, the present disclosure relates to chassis for housing telecommunications equipment.

BACKGROUND

In telecommunications, high density is desirable, especially if accommodating standard sized equipment or standard footprints. However, achieving high density and standardization in telecommunication connectivity leads to certain design challenges. Cable management and easy access are both issues that must be taken into consideration in configuration of high density equipment. There is a need in the art for telecommunications equipment that can achieve high connectivity density, utilize standard footprints, and provide effective cable management as well as easy accessibility to all major components of the equipment.

SUMMARY

The present disclosure relates to a high density mounting arrangement for mounting telecommunications equipment to a chassis, the chassis providing cable management and allowing access to major components of the equipment.

According to one aspect, the chassis of the present disclosure is configured for receiving telecommunications equipment, the telecommunications chassis defining a top, a bottom, a front side, a rear side, a right side, and a left side, the telecommunications chassis defining a central longitudinal axis extending between the top and the bottom. A first plurality of receptacles for receiving telecommunications equipment is located at the front side, a second plurality of receptacles for receiving telecommunications equipment is located at the rear side, a third plurality of receptacles for receiving telecommunications equipment is located at the right side, and a fourth plurality of receptacles for receiving telecommunications equipment is located at the left side. When mounted to a fixed surface, the telecommunications chassis is rotatable relative to the fixed surface about the central longitudinal axis.

According to another aspect, the chassis of the present disclosure is configured for receiving telecommunications equipment, the telecommunications chassis defining a top, a bottom, a front side, a rear side, a right side, and a left side, the telecommunications chassis defining a central longitudinal axis extending between the top and the bottom. A first pair of panels is located at the front side, a second pair of panels is located at the rear side, a third pair of panels is located at the right side, and a fourth pair of panels is located at the left side of the telecommunications chassis, each panel of the pairs of panels defining a plurality of receptacles for receiving the telecommunications equipment. Each panel of any given pair of panels is pivotable away from the other panel of the any given pair of panels about a pivot axis parallel to the central longitudinal axis of the chassis.

According to another aspect, the present disclosure is directed to a telecommunications device including a telecommunications chassis. The telecommunications chassis is configured for receiving telecommunications equipment. The telecommunications chassis defines a top, a bottom, a front side, a rear side, a right side, and a left side, the telecommunications chassis defining a central longitudinal axis extending between the top and the bottom. A first pair of panels is located at the front side, a second pair of panels is located at the rear side, a third pair of panels is located at the right side, and a fourth pair of panels is located at the left side. Each panel of the pairs of panels defines a plurality of receptacles for receiving the telecommunications equipment. When mounted to a fixed surface, the telecommunications chassis is rotatable relative to the fixed surface about the central longitudinal axis. Each panel of any given pair of panels is pivotable away from the other panel of the any given pair of panels about a pivot axis parallel to the central longitudinal axis of the chassis.

According to another aspect, the present disclosure relates to a method of using a telecommunications device comprising providing a telecommunications chassis configured for receiving telecommunications equipment, wherein the telecommunications chassis defines a top, a bottom, a front side, a rear side, a right side, and a left side, the telecommunications chassis defining a central longitudinal axis extending between the top and the bottom, providing a first plurality of receptacles for receiving telecommunications equipment at the front side, a second plurality of receptacles for receiving telecommunications equipment at the rear side, a third plurality of receptacles for receiving telecommunications equipment at the right side, and a fourth plurality of receptacles for receiving telecommunications equipment at the left side, and rotating the telecommunications chassis relative to a fixed surface on which the telecommunications chassis has been mounted about the central longitudinal axis to access a plurality of receptacles located on at least one of the right side and the left side of the chassis from either the front side or the rear side of the chassis.

According to yet another aspect, the present disclosure relates to a method of using a telecommunications device comprising providing a telecommunications chassis configured for receiving telecommunications equipment, wherein the telecommunications chassis defines a top, a bottom, a front side, a rear side, a right side, and a left side, the telecommunications chassis defining a central longitudinal axis extending between the top and the bottom, providing a first pair of panels located at the front side, a second pair of panels located at the rear side, a third pair of panels located at the right side, and a fourth pair of panels located at the left side of the telecommunications chassis, each panel of the pairs of panels defining a plurality of receptacles for receiving the telecommunications equipment, and pivoting a panel of a given pair of panels away from the other panel of the given pair of panels about a pivot axis parallel to the central longitudinal axis of the chassis.

A variety of additional inventive aspects will be set forth in the description that follows. The inventive aspects can relate to individual features and combinations of features. It is to be understood that both the foregoing general description and the following detailed description are exemplary and explanatory only and are not restrictive of the broad inventive concepts upon which the embodiments disclosed herein are based.

BRIEF DESCRIPTION OF THE DRAWINGS

FIGS. 6A-6D diagrammatically illustrate the rotatability of the telecommunications chassis of FIG. 1;

FIG. 7 is a top view of the telecommunications chassis of FIG. 1 illustrated with one example layout of cable management structures around the chassis;

DETAILED DESCRIPTION

Figure 1:
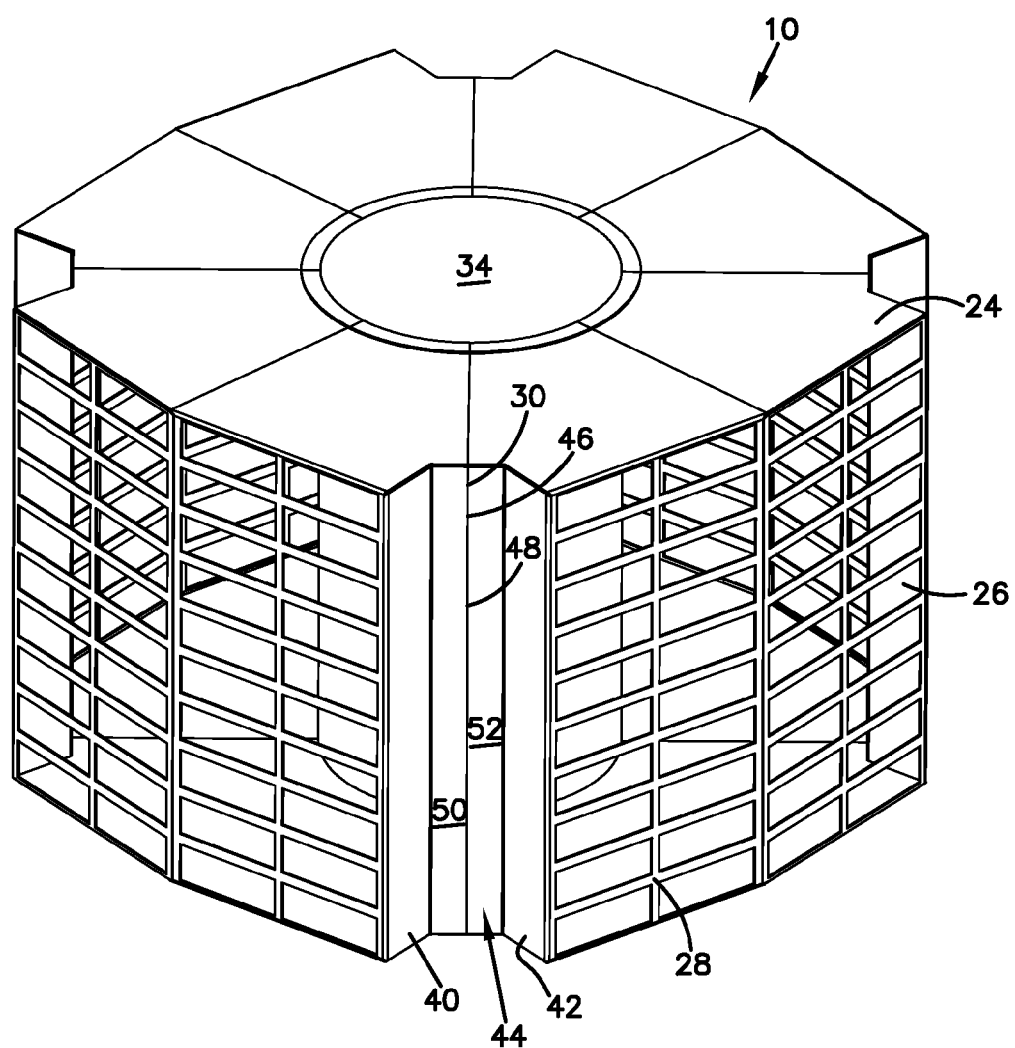
FIG. 1 is a top, front, right side perspective view of a first embodiment of a telecommunications chassis having features that are examples of inventive aspects in accordance with the present disclosure.
Figure 2:
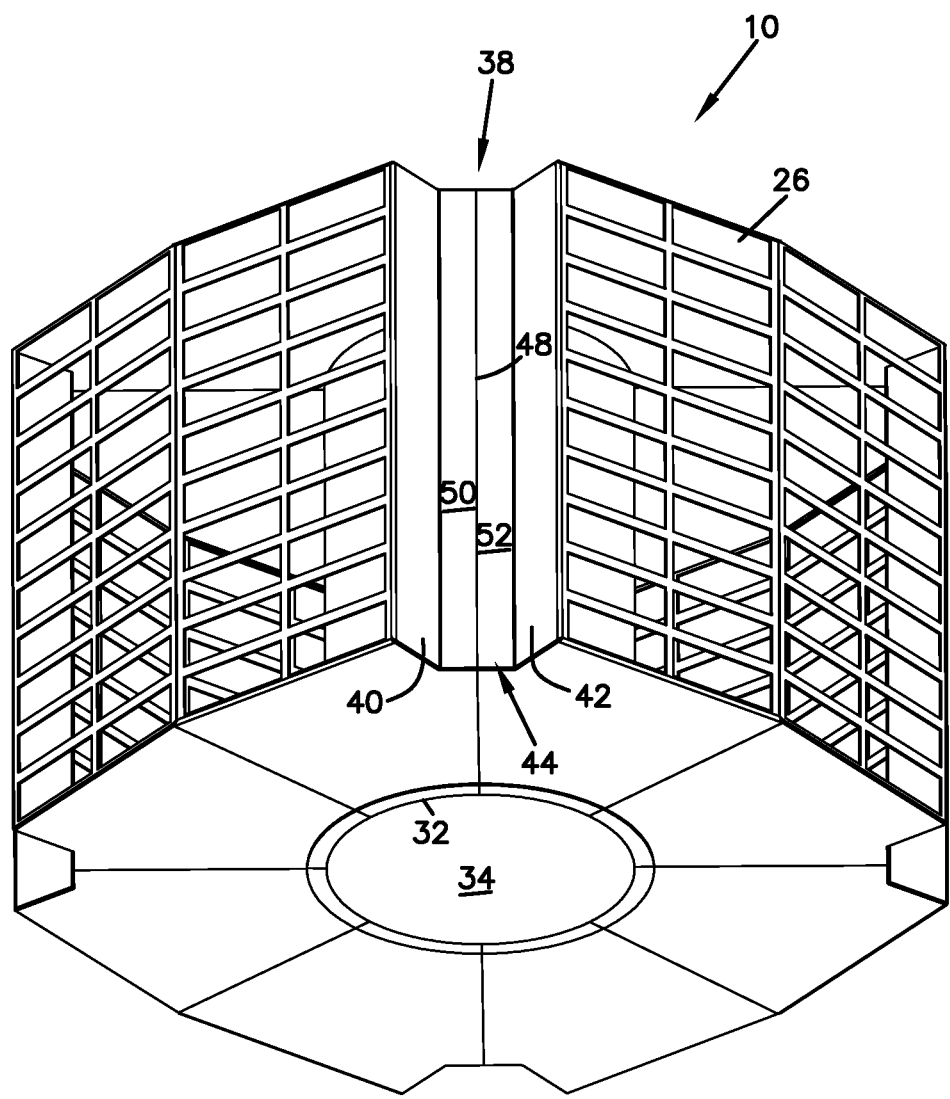
FIG. 2 is a bottom, front, right side perspective view of the telecommunications chassis of FIG. 1.
Figure 3:
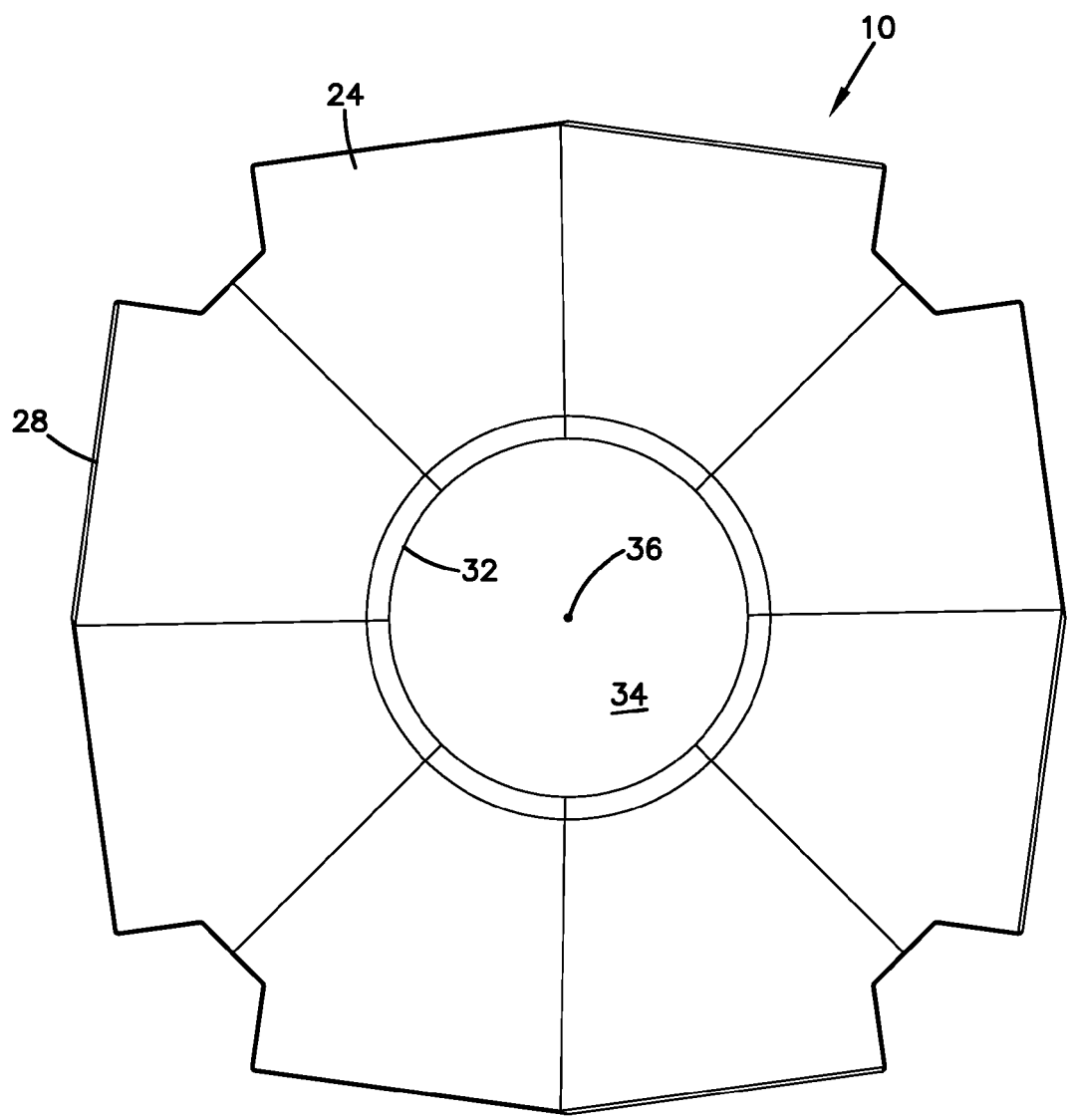
FIG. 3 is a top view of the telecommunications chassis of FIG. 1.
Figure 4:
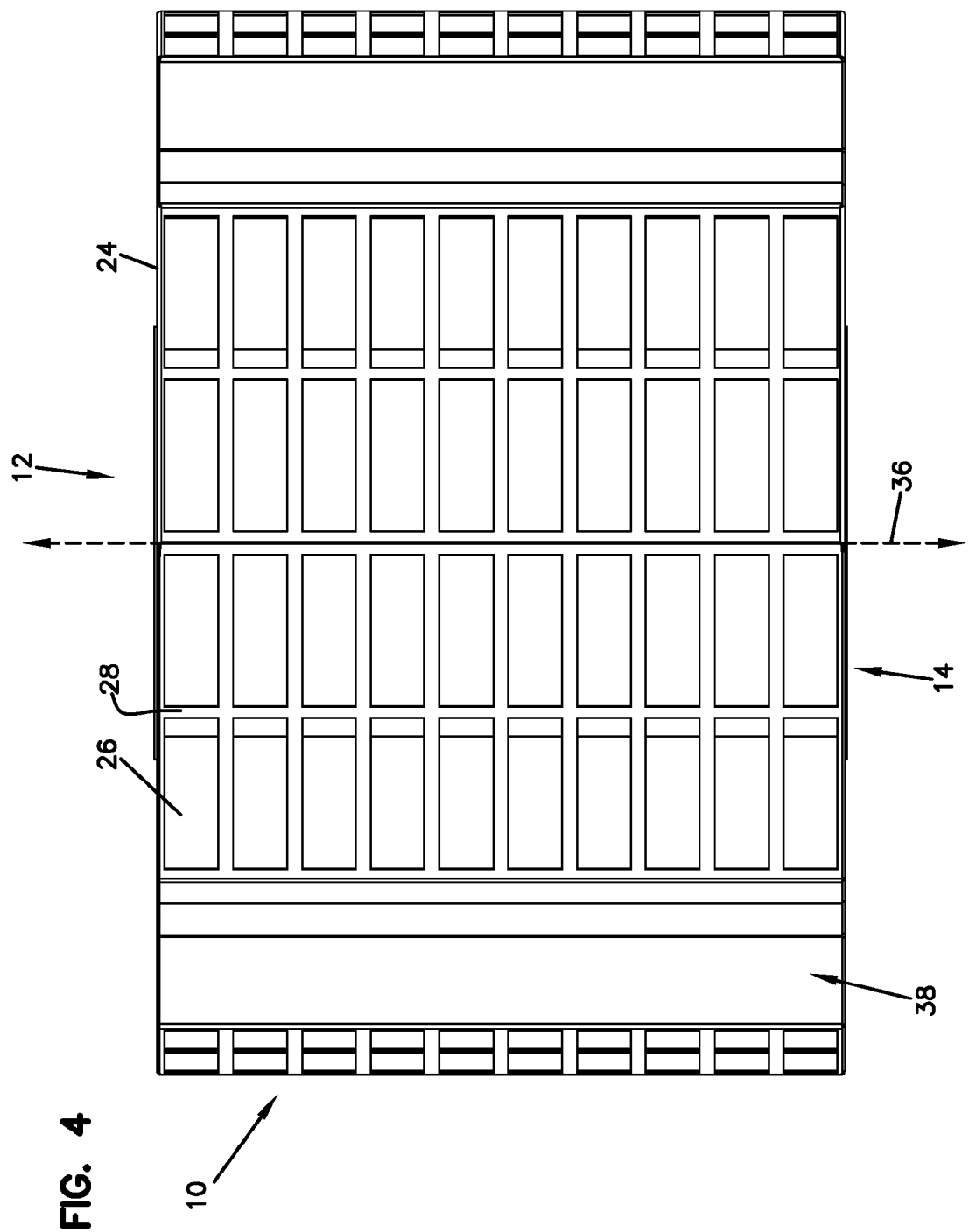
FIG. 4 is a front view of the telecommunications chassis of FIG. 1.

Reference will now be made in detail to examples of inventive aspects of the present disclosure which are illustrated in the accompanying drawings. Wherever possible, the same reference numbers will be used throughout the drawings to refer to the same or like parts.

According to the present disclosure, a telecommunications chassis configured to house telecommunications equipment in a high density arrangement is provided. As will be discussed in further detail below, the telecommunications chassis is configured with cable management features for managing cables extending to and/or from the telecommunications equipment. In addition, the telecommunications chassis is configured to allow access to all major components of the equipment.

Referring now to FIGS. 1-7, a first embodiment of a telecommunications chassis 10 having features that are examples of inventive aspects in accordance with the principles of the present disclosure is illustrated. Another embodiment of a telecommunications chassis 100 including features similar to the first embodiment 10 is shown in FIGS. 8-11.

Referring to FIGS. 1-7, the telecommunications chassis 10 defines a top 12, a bottom 14, a front side 16, a rear side 18, a right side 20, and a left side 22. The chassis 10 is configured to removably receive and house telecommunications equipment in a stacked arrangement, wherein the telecommunications equipment are generally stacked in a direction from top 12 to bottom 14.

The depicted chassis 10 includes eight panels 24, each including receptacles 26 for receiving the telecommunications equipment. In the depicted embodiment, each panel 24 includes two columns of receptacles 26 extending in a direction from top 12 to bottom 14. Two of the panels 24 define front faces 28 that are exposed toward the right side 20, two of the panels 24 define front faces 28 that are exposed toward the left side 22, two of the panels 24 define front faces 28 that are exposed toward to the front side 16, and two of the panels 24 define front faces 28 that are exposed toward the rear side 18.

According to example embodiments, the types of telecommunications equipment that may be mounted to the chassis 10 may be removable, modular type equipment. Such equipment may include electrical equipment such as digital cross-connect jack modules or cassettes. Such modules may include jacks having RJ-45 profiles, including Cat-5e jacks, or 10-Gig jacks as known in the art. The jack modules may define connection locations (e.g., ports) at the fronts of the modules and connection locations at the rears of the modules.

In the depicted embodiment, each panel 24 of the chassis 10 is configured with twenty receptacles 26 (two columns of ten receptacles 26) for holding twenty modules or cassettes. Thus, in the depicted embodiment, the chassis 10 has the capacity to hold one hundred sixty modules or cassettes, forty at each side (or quadrant) 16, 18, 20, 22 of the chassis 10. Other numbers are possible.

Figure 5:
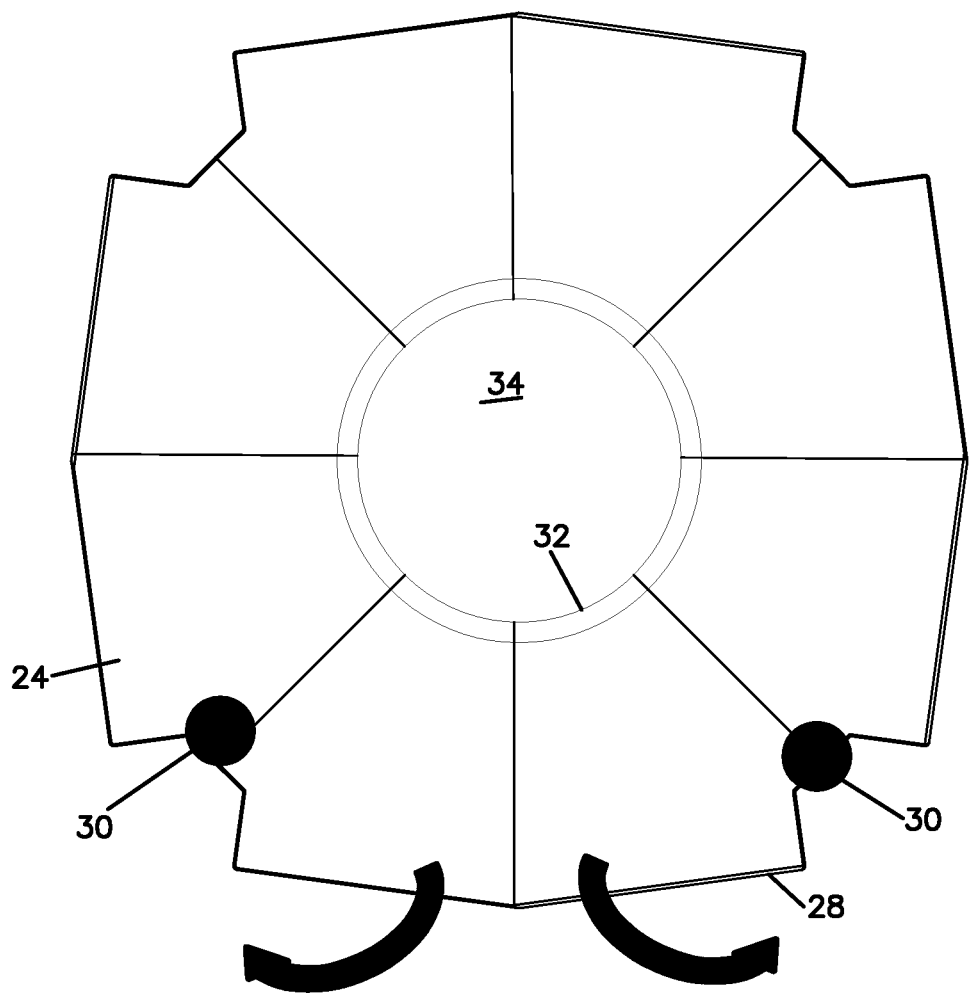
FIG. 5 diagrammatically illustrates the pivotability of the individual panels that make up the telecommunications chassis of FIG. 1.
Figure 8:
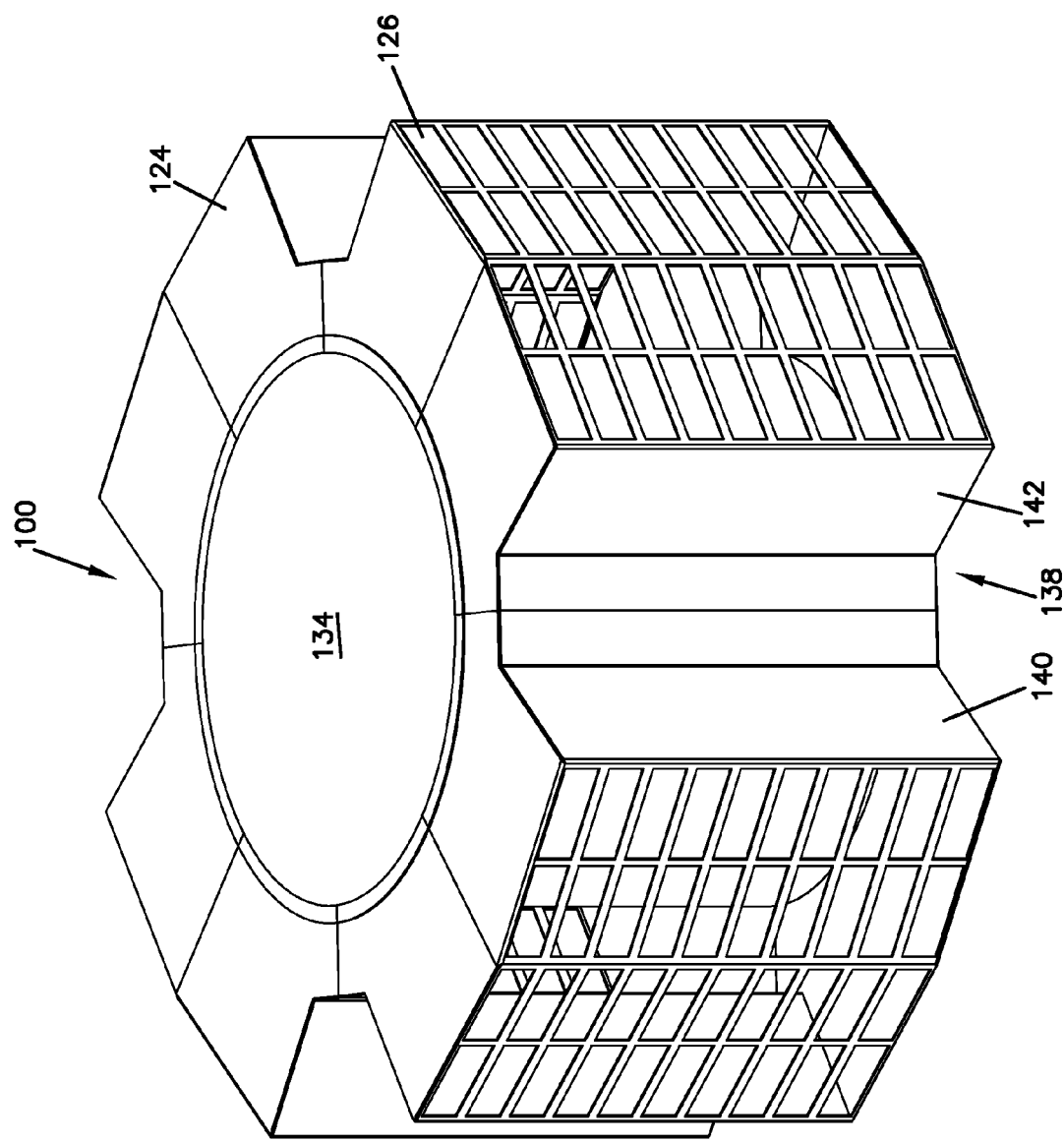
FIG. 8 is a top, front, right side perspective view of a second embodiment of a telecommunications chassis having features that are examples of inventive aspects in accordance with the present disclosure.
Figure 9:
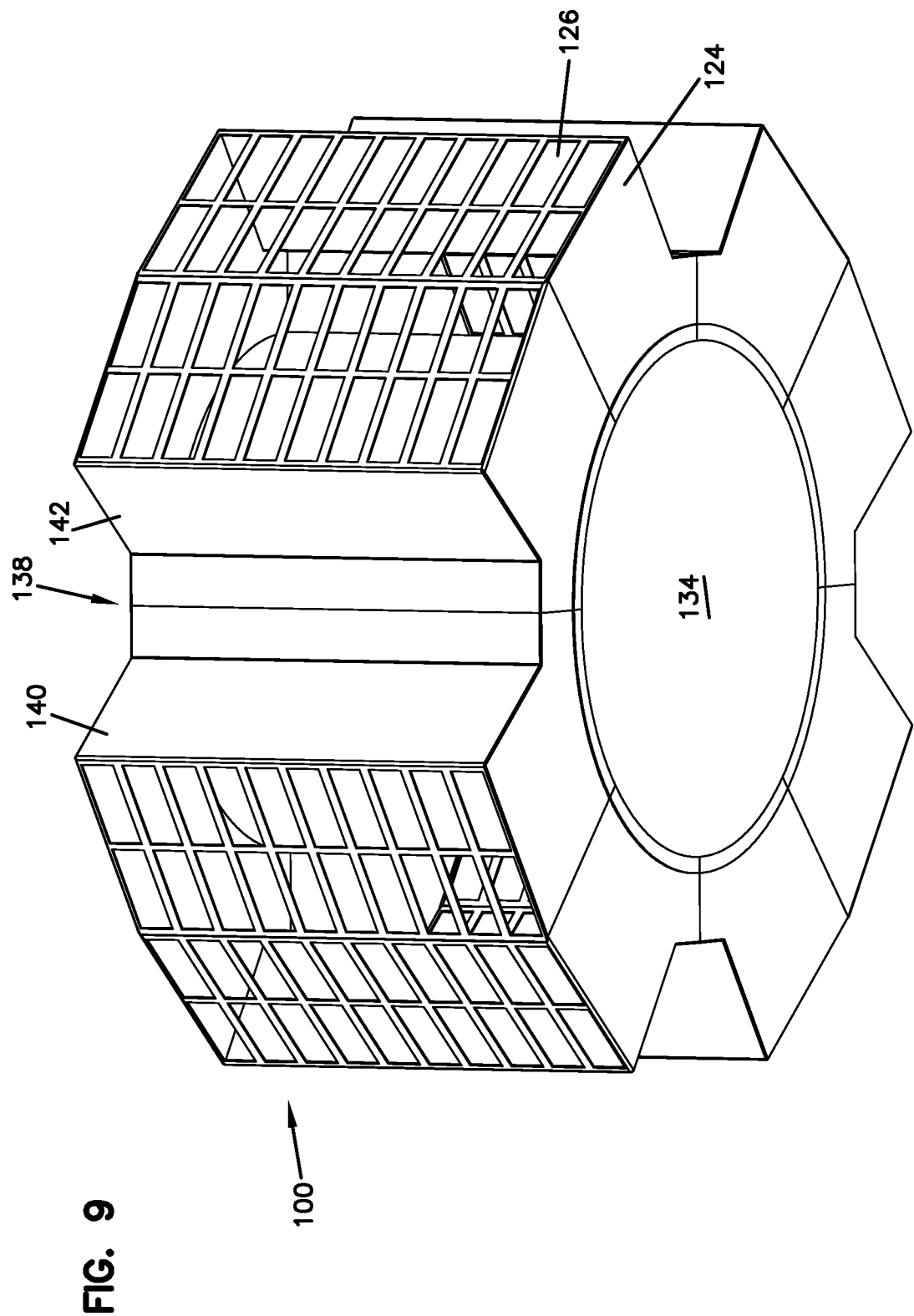
FIG. 9 is a bottom, front, right side perspective view of the telecommunications chassis of FIG. 8.
Figure 10:
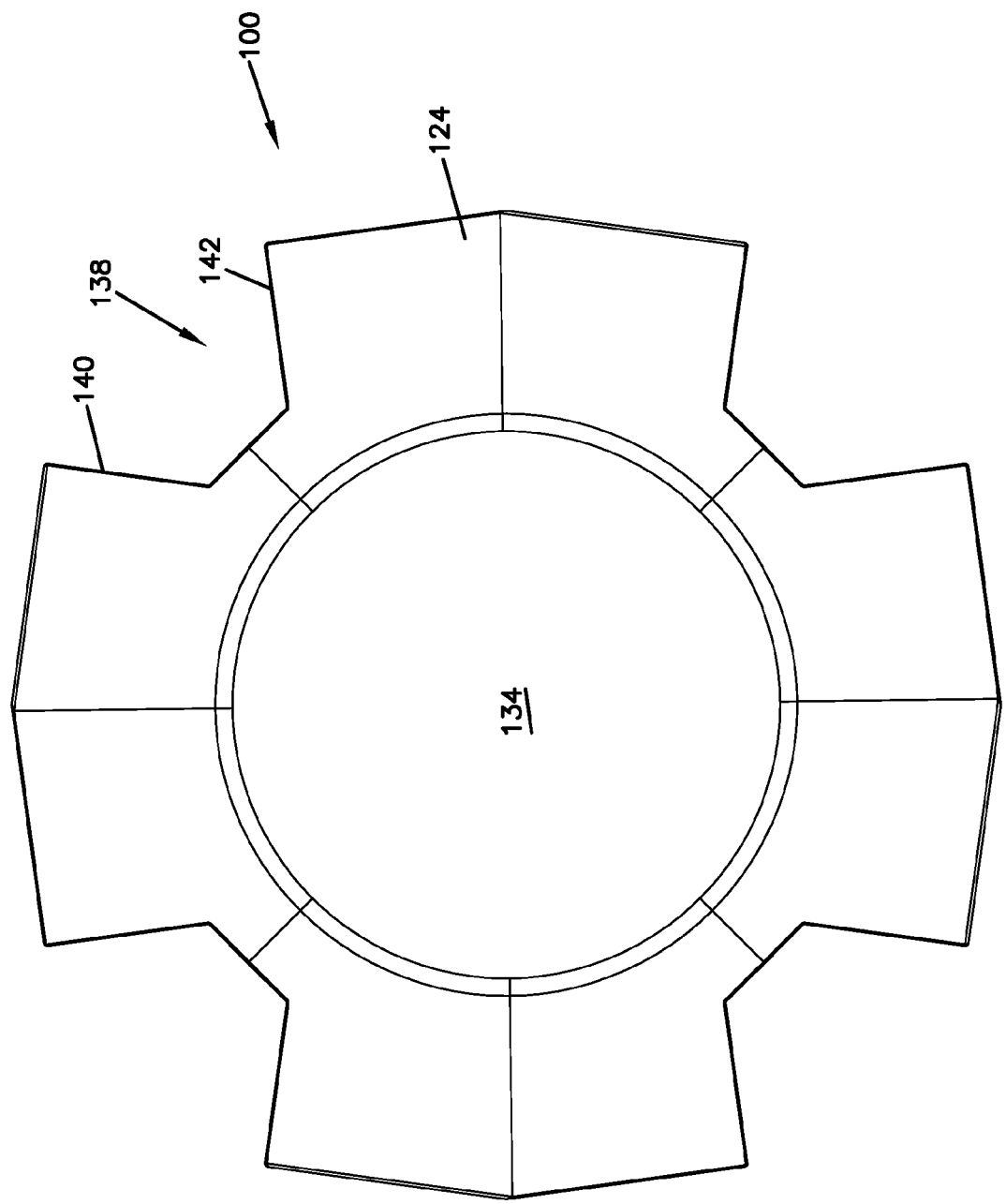
FIG. 10 is a top view of the telecommunications chassis of FIG. 8.
Figure 11:
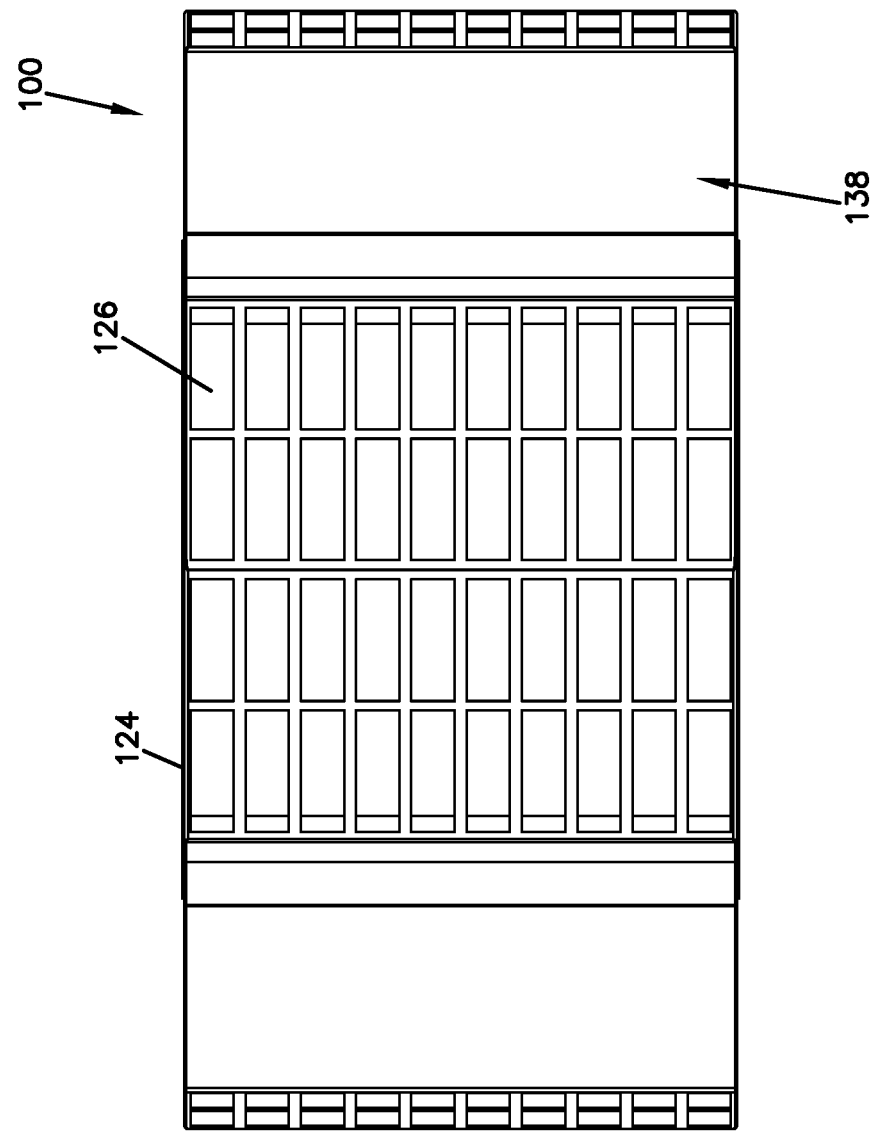
FIG. 11 is a front view of the telecommunications chassis of FIG. 8.

As shown in the diagrammatic view in FIG. 5, each of the panels 24 that make up the pair of panels 24 of a given side or quadrant 16, 18, 20, 22 is configured to pivotably move away from the other panel 24 of the pair. As shown in FIG. 5, the panels 24 are configured to pivot about pivot axes 30. By pivoting a desired panel 24, a technician is able to gain access to components such as connection locations of telecommunications equipment that are located at the rears of the equipment (and at the rear faces 32 of the panels 24) and that otherwise would not be accessible from a peripheral exterior of the chassis 10.

As shown in FIGS. 1-7, the chassis 10 defines a central opening 34 extending therethrough in a direction from the top 12 of the chassis 10 toward the bottom 14 of the chassis 10. The central opening 34 is configured to accommodate cables that extend to and/or from the components at the rears of the equipment. As noted above, by pivoting a desired panel 24 about a pivot axis 30, components or connection locations of telecommunications equipment that are otherwise only accessible from the rear face 32 of a panel 24, the central opening 34, and any cabling therewithin may be accessed.

As illustrated in FIG. 6, the chassis 10 is configured such that it can be rotated about a longitudinal axis 36 extending through the center of the opening 34. According to one example embodiment, the chassis 10 is rotatable 90 degrees in a clockwise direction. In such an embodiment, a technician standing at the front side 16 of the chassis 10 (facing the front faces 28 of the panels 24 at the front side 16) can rotate the chassis 90 degrees in a clockwise direction to access the front faces 28 of panels 24 that are normally positioned on the right side 20 of the chassis 10. Similarly, a technician standing at the rear side 18 of the chassis 10 (facing the front faces 28 of the panels 24 at the rear side 18) can rotate the chassis 90 degrees in a clockwise direction to access the front faces 28 of panels 24 that are normally positioned on the left side 22 of the chassis 10. In this manner, if multiple chassis, similar to chassis 10 of FIGS. 1-7, are located in a telecommunications environment such as a data center, aisles only at the front 16 and the back 18 of the chassis 10 need to be provided and full access to all sides 16, 18, 20, 22 of the chassis 10 are provided by the rotational arrangement of the chassis 10. The rotational arrangement also keeps any cables extending to and/or from the mounted telecommunications equipment generally close to the center of the chassis 10, limiting the need for extensive cable slack.

It should be noted that the rotational arrangement discussed above, including the angle of rotation and the direction of rotation, is simply one example and the chassis 10 can be configured for different angles and different freedoms of movement, depending upon the desired connectivity and cabling arrangement.

Still referring to FIGS. 1-7, the chassis 10 also provides for cable management features around the outer periphery of the chassis 10. Each pair of panels 24 defines a cable channel or trough 38 with an adjacent pair of panels 24 that is located generally 90 degrees therefrom. As shown, each cable trough 38 is defined by a first sidewall 40, a second sidewall 42, and an intermediate wall 44 that connects the first sidewall 40 to the second sidewall 42. As shown, hinges 46 that allow the panels 24 to pivot generally about the pivot axes 30 extend along the centerline 48 of the intermediate wall 44. When the panels 24 pivot, the first and second sidewalls 40, 42 move toward each other. The spacing provided by the cable trough 38 accommodates the moving panels 24.

The first and second sidewalls 40, 42 defining the cable troughs 38 are defined by panels 24 that are located at sides (i.e., quadrants) that are generally 90 degrees apart. For example, if the first sidewall 40 defining a cable trough 38 is of a panel 24 at the front side 16 of the chassis 10, the second sidewall 42 defining the cable trough 38 is of a panel 24 that may be located at the right side 20 of the chassis 10. In contrast, the intermediate wall 44 defining the trough 38 that extends between the first sidewall 40 and the second sidewall 42 is a shared wall. A first half 50 of the intermediate wall 44 is formed by a first panel 24 and the second half 52 of the intermediate wall 44 is formed by another panel 24 that is located at a side (quadrant) that is generally 90 degrees therefrom.

Cables extending from and/or to the front faces 28 of the panels 24 may be guided through the cable troughs 38. According to one example embodiment, cable management structures 54 in form of cable management rings 56 may be used at locations adjacent the troughs 38 for keeping cables organized within the troughs 38. FIG. 7 is a top view of the chassis 10 illustrating one possible positional layout for the cable management rings 56. The cable management rings 56 may be attached to the first sidewall 40 defining the trough 38, to the second sidewall 42 defining the trough 38, to the intermediate wall 44 defining the trough 38, or to the front faces 28 of the panels 24 adjacent the troughs 38. Other locations are certainly possible. In a preferred embodiment, each row of receptacles 26 is provided with a corresponding row of cable management rings 56.

Figure 12:
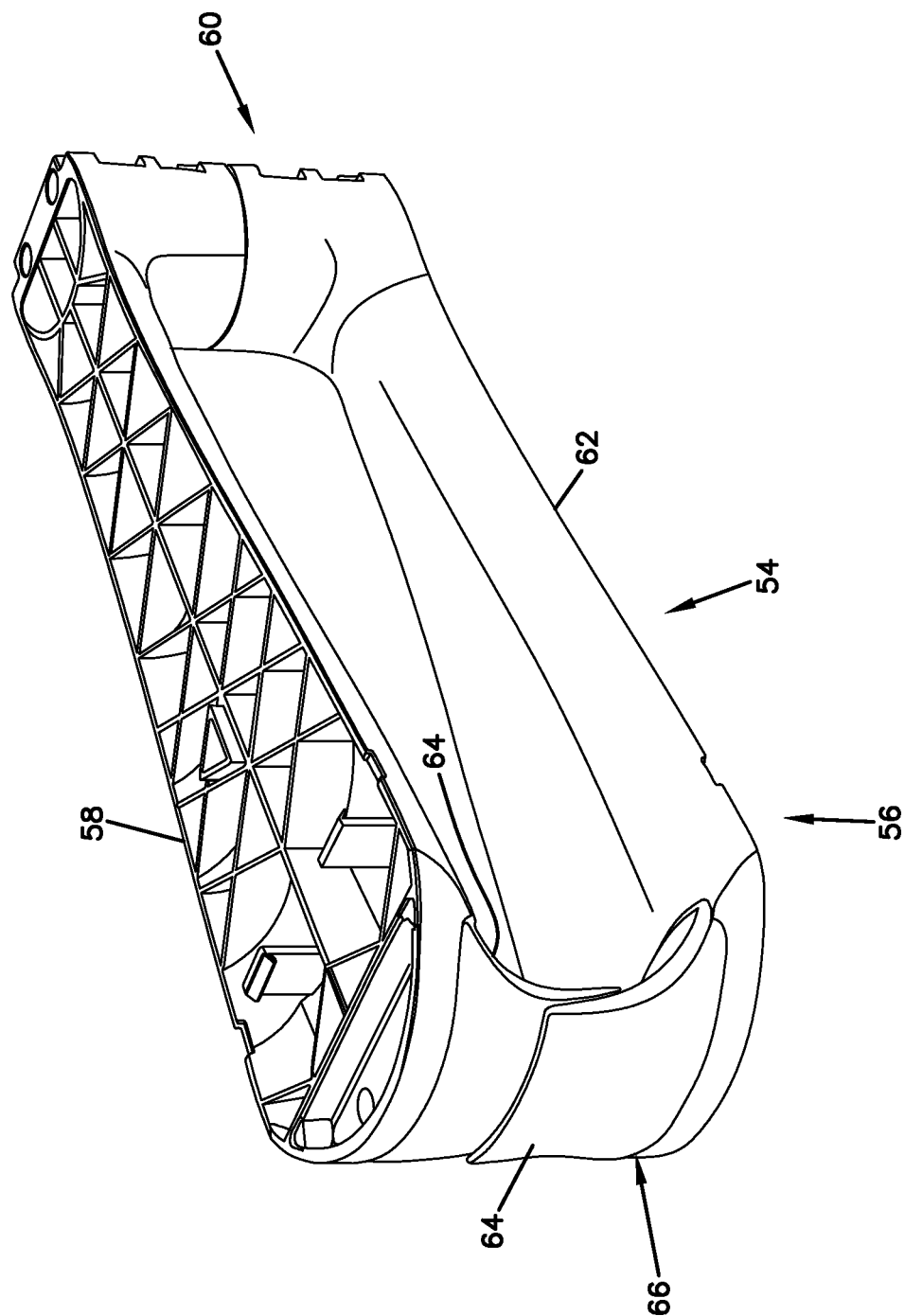
FIG. 12 illustrates in isolation one of the cable management structures of FIG. 7 in the form of a cable management ring that is suitable for use with the chassis of FIGS. 1-7 and chassis of FIGS. 8-11.

An example cable management ring 56 that may be suitable for use with the chassis 10, 100 of the present disclosure is shown in isolation in FIG. 12. According to one embodiment, the cable management ring 56 shown in FIG. 12 may be manufactured out of various types of polymers. The cable management ring 56 includes an upper half 58 that is attached at a first end 60 to a lower half 62. Each of the upper half 58 and the lower half 62 defines a transverse extension 64 (e.g. a flexible flap) at a second end 66. The extensions 64 overlap or intermate to capture a cable passing through the ring 56 between the upper half 58 and the lower half 62. If a cable needs to be inserted into or removed from the cable management ring 56, it is passed through the flexible extensions from the second end 66 thereof When the cable management rings 56 are mounted to telecommunications structures such as the chassis 10, 100 of the present disclosure, the rings 56 are generally mounted adjacent their first ends 60.

It should be noted that the cable management ring 56 illustrated in FIGS. 7 and 12 and described above is only one example of a variety of different cable management structures 54 that may be used with the chassis 10, 100 of the present disclosure and other structures are possible.

FIGS. 8-11 illustrate the second embodiment of a chassis 100 having features that are examples of inventive aspects in accordance with the present disclosure. The chassis 100 is similar in construction and operation to the chassis 10 described above and shown in FIGS. 1-7. The chassis 100 defines a slightly different overall shape than the chassis 10 of FIGS. 1-7. The chassis 100 of FIGS. 8-12 defines a larger central opening 134 and larger troughs 138 between the panels 124, defined by deeper first and second sidewalls 140, 142.

It should be noted that, although the chassis 10, 100 of the present disclosure have been described and depicted herein as defining a certain height or including a certain number of receptacles 26, 126 for receiving equipment, the chassis 10, 100 may be configured to a variety of equipment sizes and numbers. According to certain embodiments, the chassis 10, 100 may be manufactured in a certain height or size depending upon the desired connectivity application. According to other embodiments, the chassis 10, 100 may be provided in modular form, wherein similar chassis 10, 100 may be stacked on top of each other to increase the density of the connections. When stacked on top of each other, each chassis 10, 100 may still be configured to rotate individually or the stacked chassis may be provided with a locking arrangement to have the chassis 10, 100 rotate in unison. The same principles could be applied to the pivoting of the panels 24, 124.

Examples of various inventive aspects of the present disclosure have been described herein. It will be appreciated that modifications and equivalents of the disclosed inventive aspects are intended to be included within the broad scope of the present disclosure.

LIST OF REFERENCE NUMERALS AND CORRESPONDING FEATURES

10—First embodiment of a telecommunications chassis
12—Top of chassis
14—Bottom of chassis
16—Front side/quadrant of chassis
18—Rear side/quadrant of chassis
20—Right side/quadrant of chassis
22—Left side/quadrant of chassis
24—Panel
26—Receptacle
28—Front face of panel
30—Pivot axis
32—Rear face of panel
34—Central opening
36—Longitudinal axis
38—Trough
40—First sidewall
42—Second sidewall
44—Intermediate wall
46—Hinge
48—Centerline of intermediate wall
50—First half of intermediate wall
52—Second half of intermediate wall
54—Cable management structure
56—Cable management ring
58—Upper half of cable management ring
60—First end of cable management ring 62—Lower half of cable management ring
64—Transverse extension
66—Second end of cable management ring
100—Second embodiment of a telecommunications chassis
124—Panel of second embodiment of telecommunications chassis
126—Receptacle of second embodiment of telecommunications chassis
134—Central opening of second embodiment of telecommunications chassis
138—Trough of second embodiment of telecommunications chassis
140—First sidewall defining trough of second embodiment of telecommunications chassis
142—Second sidewall defining trough of second embodiment of telecommunications chassis

We claim:

1. A telecommunications device comprising:
a telecommunications chassis (10/100) configured for receiving telecommunications equipment, the telecommunications chassis (10/100) defining a top (12), a bottom (14), a front side (16), a rear side (18), a right side (20), and a left side (22), the telecommunications chassis (10/100) defining a central longitudinal axis (36) extending between the top (12) and the bottom (14); and
a first pair of panels (24/124) located at the front side (16), a second pair of panels (24/124) located at the rear side (18), a third pair of panels (24/124) located at the right side (20), and a fourth pair of panels (24/124) located at the left side (22) of the telecommunications chassis (10/100), each panel (24/124) of the pairs of panels (24/124) defining a plurality of receptacles (26/126) for receiving the telecommunications equipment;
wherein, when mounted to a fixed surface, the telecommunications chassis (10/100) is rotatable relative to the fixed surface about the central longitudinal axis (36); and
wherein each panel (24/124) of any given pair of panels (24/124) is pivotable away from the other panel (24/124) of the any given pair of panels (24/124) about a pivot axis (30) parallel to the central longitudinal axis (36) of the chassis (10/100), wherein the pivot axis (30) for each panel (24/124) is defined by a hinge (46) that is shared by and pivotally connects a panel (24/124) of a given pair of panels (24/124) with a panel (24/124) of an adjacent pair of panels (24/124), wherein a cable trough (38/138) is defined between each pair of panels (24/124) around a periphery of the telecommunications chassis (10/100), the cable troughs (38/138) extending from the top (12) to the bottom (14), each cable trough (38/138) being defined by a first sidewall (40/140), a second sidewall (42/142), and an intermediate sidewall (44) that connects the first sidewall (40/140) to the second sidewall (42/142), the hinge (46) for pivotally connecting the panels (24/124) of adjacent pairs of panels (24/124) defined along a centerline (48) of the intermediate sidewall (44) such that when the panels (24/124) of adjacent pairs of panels (24/124) pivot, the first and second sidewalls (40/140, 42/142) move toward each other such that each trough (38/138) is configured to not only guide cables extending from the panels (24/124) but also provide spacing to accommodate pivotal movement of the panels (24/124) of the adjacent pairs of panels (24/124) toward each other.

2. A telecommunications device according to claim 1, wherein the receptacles (26/126) defined by each panel (24/124) are configured in a stacked arrangement extending from the top (12) to the bottom (14).

3. A telecommunications device according to claim 2, wherein each panel (24/124) defines two columns of receptacles (26/126) stacked in a direction from the top (12) to the bottom (14).

4. A telecommunications device according to claim 1, wherein each panel (24/124) defines twenty receptacles (26/126).

5. A telecommunications device according to claim 1, wherein the telecommunications chassis (10/100) further defines an opening (34/134) extending therethrough in a direction parallel to the central longitudinal axis (36).

6. A telecommunications device according to claim 5, wherein the opening (34/134) is a central opening defining the central longitudinal axis (36).

7. A telecommunications device according to claim 1, wherein the telecommunications chassis (10/100) further includes cable management structures (54) configured to guide cables extending to and/or from the telecommunications equipment toward the troughs (38/138).

8. A telecommunications device according to claim 7, wherein the cable management structures (54) are defined by cable management rings (56).

9. A telecommunications device according to claim 8, wherein the receptacles (26/126) are provided in rows around a periphery of the telecommunications chassis (10/100), wherein each row of receptacles (26/126) around the periphery of the telecommunications chassis (10/100) includes a corresponding row of cable management rings (56).

10. A telecommunications device according to claim 1, wherein chassis (10/100) is rotatable about the central longitudinal axis (36) over a range of about 90 degrees.

11. A method of using a telecommunications device, the method comprising:
providing a telecommunications chassis (10/100) configured for receiving telecommunications equipment, wherein the telecommunications chassis (10/100) defines a top (12), a bottom (14), a front side (16), a rear side (18), a right side (20), and a left side (22), the telecommunications chassis (10/100) defining a central longitudinal axis (36) extending between the top (12) and the bottom (14);
providing a first pair of panels (24/124) located at the front side (16), a second pair of panels (24/124) located at the rear side (18), a third pair of panels (24/124) located at the right side (20), and a fourth pair of panels (24/124) located at the left side (22) of the telecommunications chassis (10/100), each panel (24/124) of the pairs of panels (24/124) defining a plurality of receptacles (26/126) for receiving the telecommunications equipment; and
pivoting a panel (24/124) of a given pair of panels (24/124) away from the other panel (24/124) of the given pair of panels (24/124) about a pivot axis (30) parallel to the central longitudinal axis (36) of the chassis (10/100), wherein the pivot axis (30) for each panel (24/124) is defined by a hinge (46) that is shared by and pivotally connects a panel (24/124) of a given pair of panels (24/124) with a panel (24/124) of an adjacent pair of panels (24/124), wherein a cable trough (38/138) is defined between each pair of panels (24/124) around a periphery of the telecommunications chassis (10/100), the cable troughs (38/138) extending from the top (12) to the bottom (14), each cable trough (38/138) being defined by a first sidewall (40/140), a second sidewall (42/142), and an intermediate sidewall (44) that connects the first sidewall (40/140) to the second sidewall (42/142), the hinge (46) for pivotally connecting the panels (24/124) of adjacent pairs of panels (24/124) defined along a centerline (48) of the intermediate sidewall (44) such that when the panels (24/124) of adjacent pairs of panels (24/124) pivot, the first and second sidewalls (40/140, 42/142) move toward each other.

12. A telecommunications device comprising:
a telecommunications chassis (10/100) configured for receiving telecommunications equipment, the telecommunications chassis (10/100) defining a top (12), a bottom (14), a front side (16), a rear side (18), a right side (20), and a left side (22), the telecommunications chassis (10/100) defining a central longitudinal axis (36) extending between the top (12) and the bottom (14); and
a first pair of panels (24/124) located at the front side (16), a second pair of panels (24/124) located at the rear side (18), a third pair of panels (24/124) located at the right side (20), and a fourth pair of panels (24/124) located at the left side (22) of the telecommunications chassis (10/100), each panel (24/124) of the pairs of panels (24/124) defining a plurality of receptacles (26/126) for receiving the telecommunications equipment;
wherein each panel (24/124) of any given pair of panels (24/124) is pivotable away from the other panel (24/124) of the any given pair of panels (24/124) about a pivot axis (30) parallel to the central longitudinal axis (36) of the chassis (10/100), wherein the pivot axis (30) for each panel (24/124) is defined by a hinge (46) that is shared by and pivotally connects a panel (24/124) of a given pair of panels (24/124) with a panel (24/124) of an adjacent pair of panels (24/124), wherein a cable trough (38/138) is defined between each pair of panels (24/124) around a periphery of the telecommunications chassis (10/100), the cable troughs (38/138) extending from the top (12) to the bottom (14), each cable trough (38/138) being defined by a first sidewall (40/140), a second sidewall (42/142), and an intermediate sidewall (44) that connects the first sidewall (40/140) to the second sidewall (42/142), the hinge (46) for pivotally connecting the panels (24/124) of adjacent pairs of panels (24/124) defined along a centerline (48) of the intermediate sidewall (44) such that when the panels (24/124) of adjacent pairs of panels (24/124) pivot, the first and second sidewalls (40/140, 42/142) move toward each other such that each trough (38/138) is configured to not only guide cables extending from the panels (24/124) but also provide spacing to accommodate pivotal movement of the panels (24/124) of the adjacent pairs of panels (24/124) toward each other.

13. A telecommunications device according to claim 12, wherein the receptacles (26/126) defined by each panel (24/124) are configured in a stacked arrangement extending from the top (12) to the bottom (14).

14. A telecommunications device according to claim 13, wherein each panel (24/124) defines two columns of receptacles (24/124) stacked in a direction from the top (12) to the bottom (14).

15. A telecommunications device according to claim 12, wherein each panel (24/124) defines twenty receptacles (26/126).

16. A telecommunications device according to claim 12, wherein the telecommunications chassis (10/100) further defines an opening (34/134) extending therethrough in a direction parallel to the central longitudinal axis (36).

17. A telecommunications device according to claim 16, wherein the opening (34/134) is a central opening defining the central longitudinal axis (36).

\* \* \* \* \*